United States Patent
Cucchi et al.

(10) Patent No.: US 7,346,826 B2
(45) Date of Patent: Mar. 18, 2008

(54) ERASURE FEC DECODER AND METHOD

(75) Inventors: Silvio Cucchi, Gaggiano (IT); Sonia Rinaldi, Tirano (IT); Marco Andreasi, Cologno Monzese (IT)

(73) Assignee: ALCATEL, Paris (FR)

( * ) Notice: Subject to any disclaimer, the term of this patent is extended or adjusted under 35 U.S.C. 154(b) by 491 days.

(21) Appl. No.: 11/012,302

(22) Filed: Dec. 16, 2004

(65) Prior Publication Data
US 2005/0204254 A1    Sep. 15, 2005

(30) Foreign Application Priority Data
Feb. 13, 2004    (EP) ................... 04290408

(51) Int. Cl.
*H03M 13/00* (2006.01)
(52) U.S. Cl. .................. 714/752
(58) Field of Classification Search ......... 714/755, 714/752
See application file for complete search history.

(56) References Cited

U.S. PATENT DOCUMENTS

| | | | |
|---|---|---|---|
| 4,653,051 A | | 3/1987 | Sugimura et al. |
| 5,684,810 A | * | 11/1997 | Nakamura et al. .......... 714/755 |
| 6,820,229 B1 | * | 11/2004 | Sollish ................ 714/767 |
| 2002/0049947 A1 | | 4/2002 | Sridharan et al. |

OTHER PUBLICATIONS

Yamane et al., Blt error rate analysis on iterative two-stage decoding of two dimensional codes by importance sampling, 2003, IEEE, p. 3140-3144.*
Seung Ho Kim et al: "Decoding Strategies for Reed-Solomon Product Codes: Application to Digital Video Recording Systems," IEEE Transactions on Consumer Electronics, IEEE Inc. New York, US, vol. 38, No. 3, Aug. 1, 1992, pp. 243-246, XP000311844.
Anonymous: "Decoding organisation for product codes" Research Disclosure, Kenneth Mason Publications, Hampshire, GB, vol. 342, No. 39, Oct. 1992, XP007118196.

* cited by examiner

*Primary Examiner*—Shelly Chase
(74) *Attorney, Agent, or Firm*—Sughrue Mion, PLLC

(57) ABSTRACT

Disclosed is a method and erasure FEC decoder for correcting a pattern of errors by a two-dimensional decoding, the pattern of errors comprising at least two codewords in both a first and a second dimensions with a number of errors in common higher than the capacity of the code which is used for decoding. The method comprises the steps of: performing a full capacity decoding along the second dimension for removing possible false corrections introduced by a previous decoding performed along the first dimension; performing a reduced-capacity decoding along the first dimension, for identifying errored codewords along the first dimension; performing a full capacity decoding along the second dimension with disabled correction feature for identifying errored codewords along the second dimension; detecting the error coordinates from the information from steps b) and c); and correcting the detected pattern of errors.

13 Claims, 7 Drawing Sheets

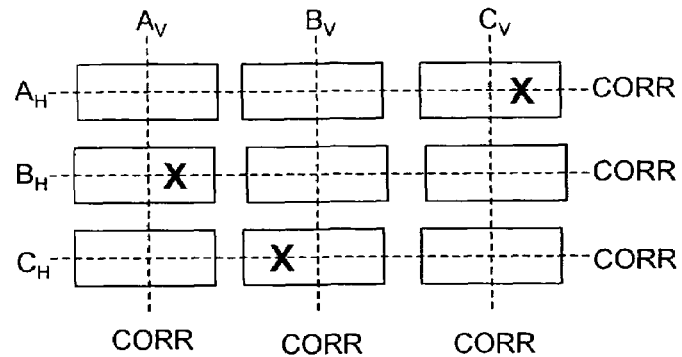
Fig. 2c
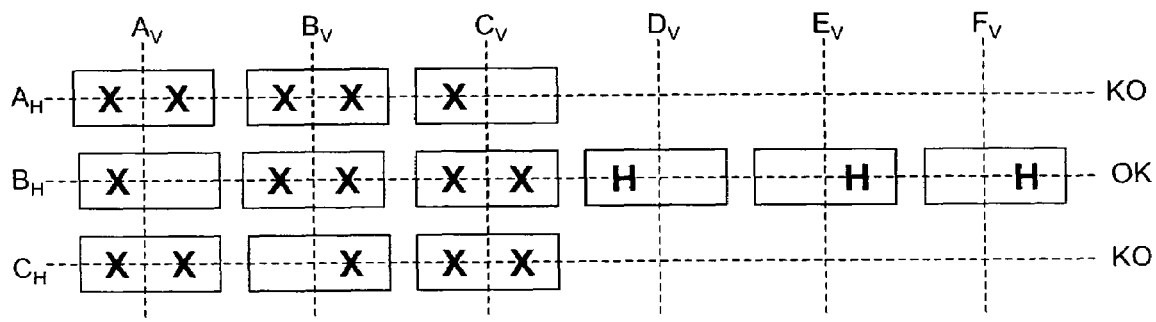
Fig. 3
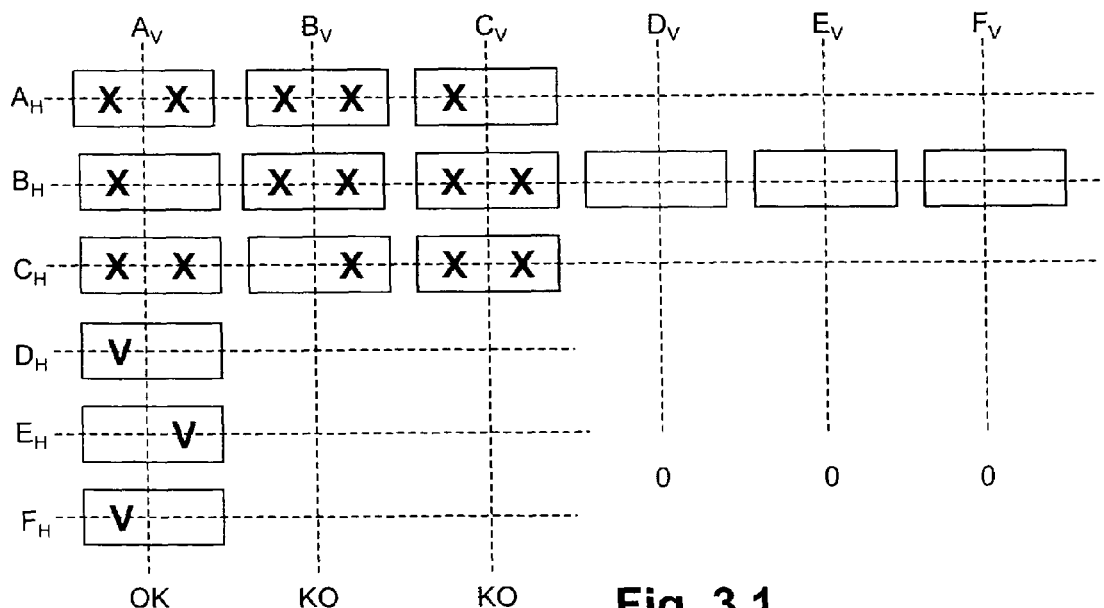
Fig. 3.1

Fig. 3.2

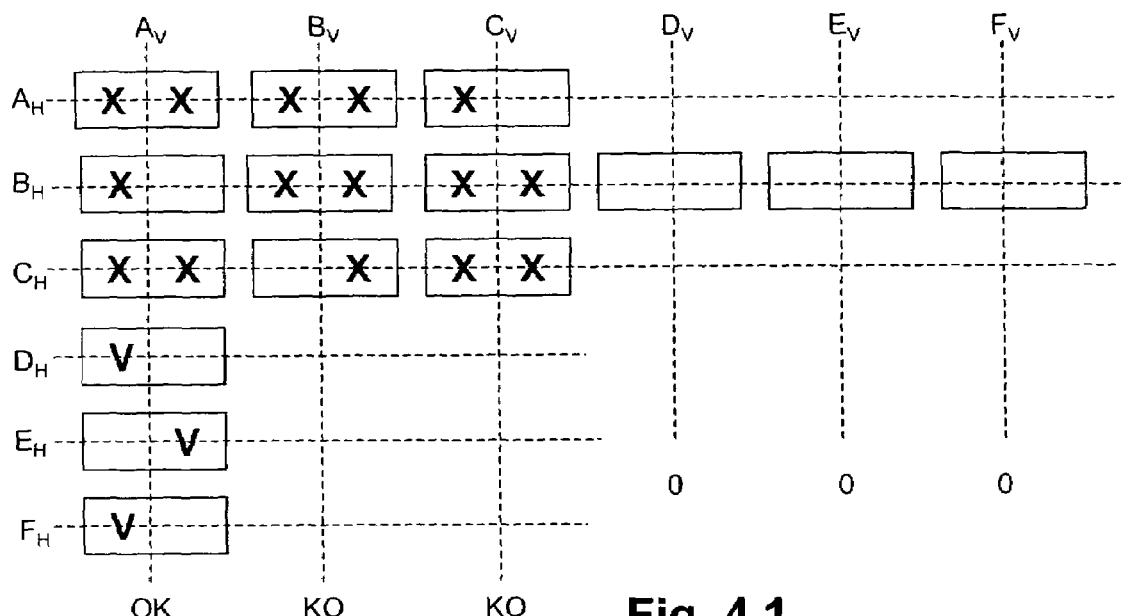
Fig. 4.1
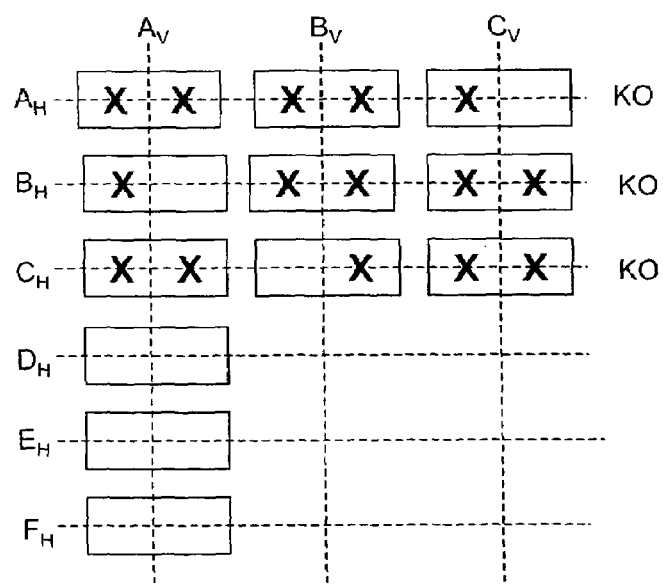
Fig. 4.2

ERASURE FEC DECODER AND METHOD

BACKGROUND OF THE INVENTION

1. Field of the Invention

The present invention relates to the telecommunication field and more in particular to the art of correction of errors which could be originated during the transmission of signals. Still more in particular, the present invention relates to an improved erasure FEC decoder and an improved method for decoding signals.

This application is based on, and claims the benefit of, European Patent Application No. 04290408.6 filed on Feb. 13, 2004, which is incorporated by reference herein.

2. Description of the Prior Art

As it is known, the Forward Error Correction (FEC) is a technique by means of which redundancy is transmitted together with transported data, using a pre-determined algorithm. The receiving device has the capability of detecting and correcting multiple bit errors that could occur during transmission thanks to the redundancy. The signal transmitted with FEC is more "robust" thus allowing operators to build up longer distance connections without the deployment of many repeater stations.

It is known to decode a two-dimensional code by using a mono-dimensional iterative decoding along both the dimensions. This because the error correction capability increases according to the number of iterations. This decoding method is not optimal and despite a decoder can correct a large number of errors by exploiting an iterative procedure, there are some error patterns that can not be corrected by using such a procedure. This is a limit to the BER_out. For this reason, this phenomenon is commonly called "decoding BER floor".

This "decoding BER floor" can be removed by using the information coming together from the two dimensions reaching "the code BER floor" that is intrinsic to the code itself.

Two are the main problems that have to be solved. From one side, it is necessary to find the remaining error positions. From the other side, it is necessary to calculate the values of the remaining errors.

Let's consider, for instance, a BCH two-dimensional code with a correction capability of three errors for both the directions. Let's also suppose, for example, that:

the minimum distance for horizontal codes is eight ($d_H=8$),
the minimum distance for vertical codes is seven ($d_v=7$), and
the number of bits that, at most, two codewords have in common (cell) is two.

There are error configurations that, by using a monodimensional iterative decoding, are not correctable. The most common pattern of errors that can not be corrected through an iterative decoding consists in eight errors distributed in four cells. If the above-mentioned cells are arranged in a way that four errors are present in all directions, no codewords are correctable by using a mono-dimensional decoding because the error correction capability is only of three symbols (in this case, BCH code, three bits). Further critical configurations (BER floors) that are not correctable through an iterative decoding could consist in 12-18 errors distributed in nine cells et caetera.

From a European patent application filed on the same date and by the same Applicant as the present patent application, titled "improved iterative n-dimensional decoding", a decoder for performing an iterative n-dimensional decoding of a data structure is known. A corresponding decoding method is also known from the same paper. Such a patent application is incorporated herewith as a reference. The invention disclosed in such a parallel application is based on the fact that, being the algebraic codes resolvable by a closed formula up to a fourth grade equation, for a n-dimensional code, in which each dimension is protected by an algebraic code having a grade $\leq 4$, it is possible to use a novel decoding computing structure that use a closed form solution to calculate errors values and their positions. The novel computing structure does not need to compute all syndromes (in all dimensions) at each decoding step. According to the invention, syndromes are computed once at the beginning of the decoding step. After that, when a bit is corrected, all the syndromes affected by such a correction are updated. The basic idea of the invention disclosed in the parallel patent application is that, from the second iteration up to the $n^{th}$ iteration, only the syndromes with a value different from zero, or the syndromes that have been updated during the previous decoding step, are processed. In this way, the time required by each sub-iteration (from second sub-iteration on) will be progressively reduced.

The processing of the syndromes is managed by a sequencer which is provided with information about the position of remaining errors at each step of the iterative process. Whilst the iterative n-dimensional decoding of a data structure according to the parallel patent application is highly effective, the above mentioned patterns of errors can not be corrected in any case but the information about the position of errors is already known by the sequencer. This is the basic point to start the erasure alghoritm. When a similar situation arises, an erasure method should be carried out.

Erasure methods are known. Generally an erasure method allows to remove some of the above-mentioned error patterns. It is based on the fact that the decoder is able to identify all the cells in which there are errored bits. In some cases, however, false corrections are possible.

The Applicant is aware of more than one theoretical algorithms that allow to solve both the above-mentioned problems in case of two-dimensional codes. However, such methods are difficult to be implemented due to their complexity. In addition, the already existing erasure algorithms are not able to identify all the cells in case of false corrections.

SUMMARY OF THE INVENTION

In view of the above, the main object of the present invention is providing an erasure method and apparatus which is able to correct erasure-patterns of errors by using the information coming from the sequencer. In particular, an object of the present invention is providing an erasure method and apparatus which is effective also against false corrections with a very high probability.

The above and further objects of the present invention are reached by a method according to claim 1 and an apparatus according to claim 7. Further advantageous features of the present invention are set forth in the corresponding claims. All the claims are deemed to be an integral part of the present description.

The present invention relates to the fact that, being algebraic codes resolvable by a closed formula up to a fourth grade equation, for a two-dimensional code in which both the dimensions are protected by a algebraic codes (grade $\leq 4$), it is possible to use a novel erasure algorithm that allows removing some common error configurations that are not presently correctable by a known iterative decoding. Indeed, there are many other decoding BER floors but the probability that these kinds of floors occur is so low and so negligible that, in this case, the implementation of a dedicated erasure algorithm is not convenient.

The erasure method according to the present invention can be divided into an errored cell detection step and into a following correction step. The errored cell detection step is a procedure that allows to find the coordinates of cells in which there are errored bits. Such a procedure can be used with a generic two-dimensional code in which both the dimensions are protected by an algebraic code (grade $\leq 4$). The correction step is a procedure allowing to correct the errored symbols whose positions are known from the previous errored cell detection step.

Presently, if the coordinates of cells are known, the error correction can be reduced to the solution of a linear system that is complex to be implemented.

Profitably, the method and apparatus according to the present invention avoids to solve a linear system, at least in case of BCH two-dimensional codes described before.

When the erasure method according to the present invention is carried out in connection with the method described in the above mentioned patent application (improved iterative n-dimensional decoding), wherein the coordinates of those codes that can not be decoded are stored, it is easily implementable.

The method and apparatus according to the present invention allows to remove all the most probable patterns of errors also in case a decoder introduces false corrections.

According to a first aspect, the present invention provides a method for correcting a pattern of errors by a two-dimensional decoding, the pattern of errors comprising at least two codewords in both a first and a second dimensions with a number of errors in common higher than the capacity of the code which is used for decoding, the method comprising the steps of:
a) performing a full capacity decoding along the second dimension for removing possible false corrections introduced by a previous decoding performed along the first dimension;
b) performing a reduced-capacity decoding along the first dimension, for identifying errored codewords along the first dimension;
c) performing a full capacity decoding along the second dimension with disabled correction feature for identifying errored codewords along the second dimension;
d) detecting the error coordinates from the information from steps b) and c); and
e) correcting the detected pattern of errors.

Step b) is performed at a reduced capacity so that the probability of false corrections is very low.

In the preferred embodiment, said first dimension and said second dimension are the horizontal and the vertical dimensions, respectively.

Typically, the full capacity of the decoding method is three in both the first and second dimensions.

Preferably, the step of performing a reduced-capacity decoding along the first dimension comprises the step of performing a decoding at a correction capacity limited to two errors. In this way, at least in the cases of BER_floor with 8, 12 and 15 errors, it is impossible, being the minimum distance for horizontal coding generally equal to 8, to re-introduce any of the false corrections removed by the previous vertical decoding.

In a preferred embodiment, step e) comprises the step e1) of complementing all the errored cells and than the step e2) of performing a decoding along at least one between said first and second dimensions.

Preferably, step e2) consists in performing a decoding along the first dimension with a full correction capability.

Profitably, the method is performed by an application-specific integrated circuit, ASIC.

According to a second aspect, the present invention provides an erasure FEC decoder for correcting a pattern of errors by a two-dimensional decoding, the pattern of errors comprising at least two codewords in both a first and a second dimensions with a number of errors in common higher than the capacity of the code which is used for decoding, the decoder comprising:
f) first decoding means for performing a full capacity decoding along the second dimension for removing possible false corrections introduced by a previous decoding performed along the first dimension;
g) second decoding means for performing a reduced-capacity decoding along the first dimension, for identifying errored codewords along the first dimension;
h) said first decoding means performing also a full capacity decoding along the second dimension with disabled correction feature for identifying errored codewords along the second dimension;
i) position error detection means for detecting the error coordinates from the information from the first and second decoding means; and
j) correction means for correcting the detected pattern of errors.

In the preferred embodiment, said first dimension and said second dimension are the horizontal and the vertical dimensions, respectively.

Typically, the full capacity of the erasure FEC decoder is three in both the first and second dimensions.

Preferably, the second decoding means for performing a reduced-capacity decoding also performs a decoding at a correction capacity limited to two errors. In this way, at least in the cases of BER_floor with 8, 12 and 15 errors, it is impossible, being the minimum distance for horizontal coding generally equal to 8, to re-introduce any of the false corrections removed by the previous vertical decoding.

In a preferred embodiment, the correction means complement all the errored cells and than perform a decoding along at least one between said first and second dimensions. Preferably, the decoding is performed along the first dimension with a full correction capacity.

Profitably, the erasure FEC decoder is embodied in an application-specific integrated circuit, ASIC.

According to a third aspect, the present invention further provides a telecommunication apparatus, typically a network element, comprising a decoder as set above.

According to a fourth aspect, the present invention further provides a computer program comprising computer program means adapted to perform the method as set above when said program is run on a computer.

According to a fifth aspect, the present invention provides a computer readable medium having a program recorded thereon, said computer readable medium comprising computer program code means adapted to perform the method as set forth above when said program is run on a computer.

The present invention will become fully clear after reading the following detailed description, given by way of example only and not of limitation, to be read with reference to the accompanying figures,

BRIEF DESCRIPTION OF THE DRAWINGS

In the drawings:

FIGS. 2a-2c diagrammatically show the patters of FIGS. 1a-1c after a bit complementing step has been carried out;

FIGS. 3, 3.1 and 3.2 show a correction loop in case false corrections are introduced during decoding steps;

BEST MODE FOR CARRYING OUT THE INVENTION

The same or similar reference numbers have been used through the various figures for indicating the same or similar parts. Each error has been represented by an "X" within a rectangular box representing a pair of bits. Each codeword has been indicated by a dotted line and a capital letter provided with a subscript: subscript "H" stands for horizontal and subscript "V" stands for vertical. For example, $A_V$ represents the vertical codeword A and $C_H$ represents the horizontal codeword C.

Figure 1A:
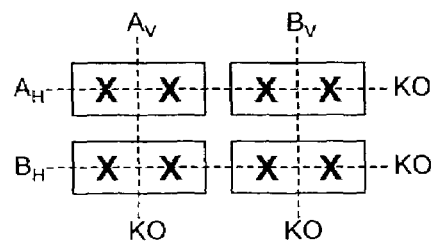
FIGS. 1a-1c diagrammatically show some patterns of errors which are not presently correctable by known erasure methods and decoders.

FIG. 1a shows, in a diagrammatic form, a possible pattern of errors which is not presently correctable by known methods and decoders having a correction capacity of three (for each codeword of the frame, the highest number of errors that could be corrected is 3). Four errors are present both along the horizontal codewords $A_H$, $B_H$ and along the vertical codewords $A_V$, $B_V$. As the number of errors is higher than the correction capacity, the presently available two-dimensional codes could not correct the pattern and issue "KO" indications along all the dimensions.

Figure 1B:
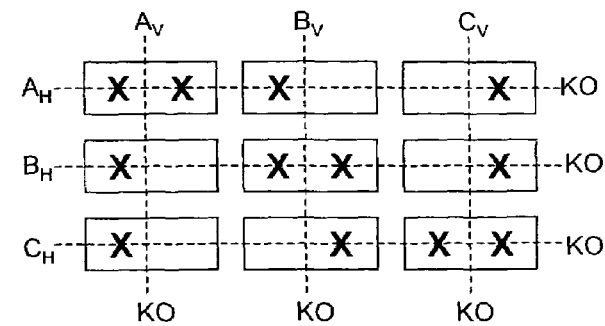
Figure 1C:
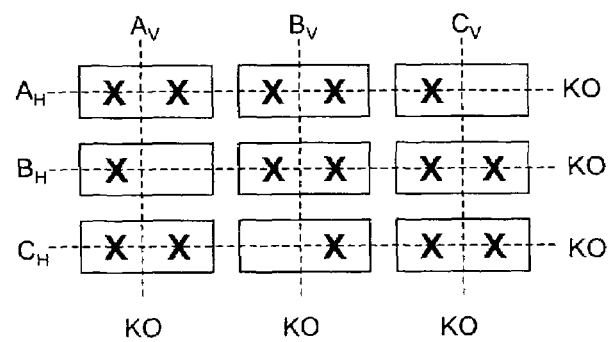

In the pattern configuration according to FIG. 1b, the number of errors along each codeword is four. Again, the presently available two-dimensional codes could not correct the pattern and issue "KO" indications along all the dimensions. An even worst situation is depicted in FIG. 1c where the number of errors along each codeword is five. Again, the presently available two-dimensional codes could not correct the pattern and issue "KO" indications along all the dimensions.

When the number of "KO" remains constant for more than one iteration during a decoding procedure, a standard decoder declares that the pattern of errors can not be corrected or calls an erasure method.

FIG. 3 shows a case in which a false correction has been made by the decoder. Specifically, a horizontal decoding has revealed that codeword AH can not be corrected ("KO" is issued) because the number of errors is five (higher than the correction capability, 3, of the code); the same for $C_H$. On the contrary, codeword $B_H$ has been wrongly corrected ("OK" is issued) and false corrections (indicated by "H") have been introduced.

During the vertical decoding (see FIG. 3.1) following the horizontal decoding of FIG. 3, the errors "H" are simply removed as the correction capability of the code is 3 and thus no problems are found in correcting single errors. The syndrome of codewords $D_V$, $E_V$ and $F_V$ becomes 0. Let's suppose that the errors along codewords $B_V$ and $C_V$ remain five and can not be corrected and thus respective "KO" are issued. Let's also suppose that the vertical decoding along $A_v$ results in a false correction and that errors "V" are introduced.

During the horizontal decoding (see FIG. 3.2) following the vertical decoding of FIG. 3.1, the errors "V" are simply removed as the correction capability of the code is 3 and thus no problems are found in correcting single errors. The syndrome of codewords $D_H$, $E_H$ and $F_H$ becomes 0. However, errors "H" are newly introduced and the situation will become as the starting situation of FIG. 3. In other words, the correction enters a loop and no correction is possible because the error coordinates can not be established.

The FEC erasure method according to the present invention can be divided into an errored cell detection step and into a correction step. The detection step, in turn, comprises the steps of.

a) performing a full capacity decoding along the vertical dimension for removing possible false corrections previously introduced by the decoding performed along the first dimension;

b) performing a reduced-capacity decoding along the horizontal dimension (so that the probability of false corrections becomes very low), for identifying errored codewords along the horizontal dimension;

c) performing a full capacity decoding along the vertical dimension with disabled correction feature for identifying errored codewords along the vertical dimension; and d) detecting the error coordinates from the information from steps b) and c).

Figure 4:
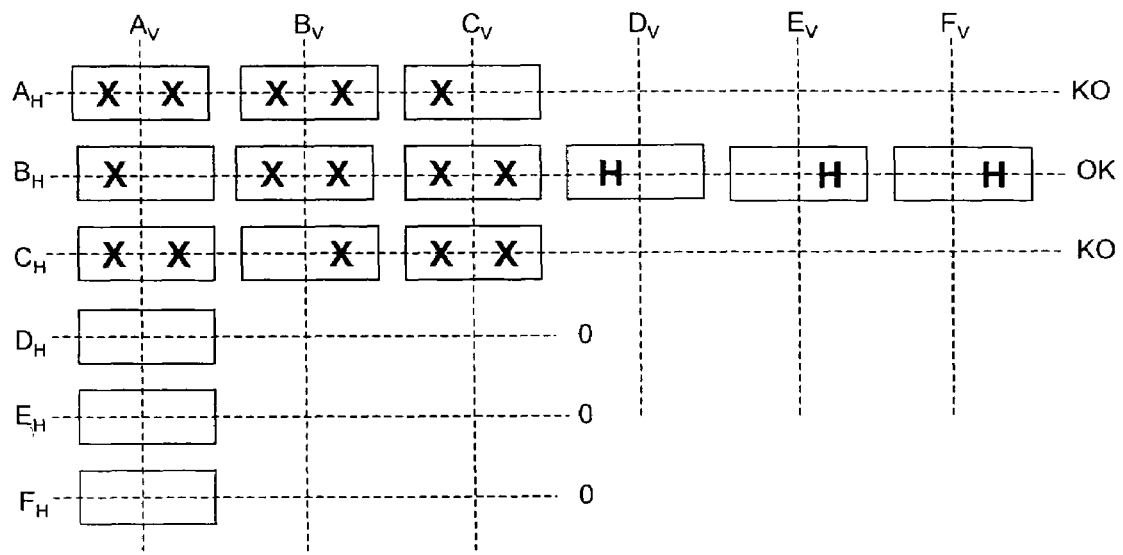
FIGS. 4, 4.1, 4.2, 4.3 and 4.4 diagrammatically show the operation of the present invention starting from a situation as the one of FIG. 3.
Figure 4:
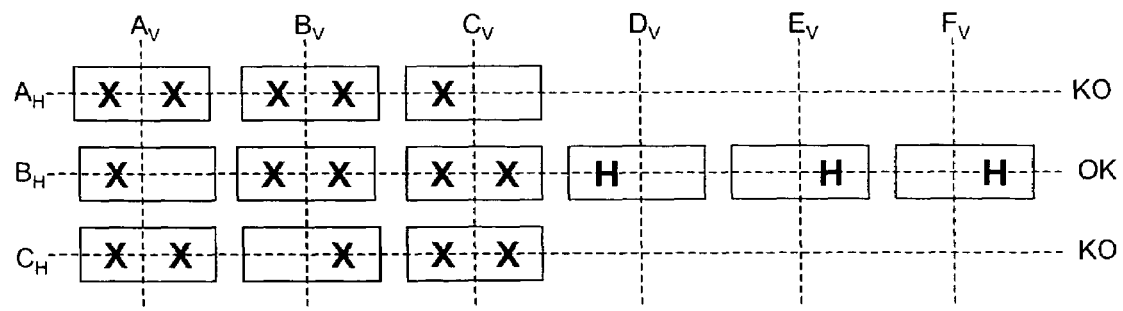

The erasure FEC method and decoder according to the present invention will become clear with reference to FIGS. 4, 4.1, 4.2, 4.3 and 4.4. The starting pattern of errors is shown in FIG. 4 (which is identical to FIG. 3) with false errors H introduced during the previous decoding step in the horizontal dimension.

In sub-step a), a vertical decoding is performed so that false errors "H" are eliminated. The syndromes become 0. As in FIG. 3.1, the horizontal decoding may result in vertical false errors "V". In sub-step b), a further horizontal decoding is carried out but the decoder is set in such a way that the capacity of horizontal correction is limited (in case the full capacity is 3, the decoder could be limited to 2, for instance). In this way, the false errors "V" are eliminated but no further horizontal errors are introduced (see FIG. 4.2). This procedure results in information about the horizontal coordinates of the errored bits. In the case shown in FIG. 4.2, from the issued "KO" indications, the decoder realizes that in codewords $A_H$, $B_H$ and $C_H$ the number of errors is higher than the highest correction capability of the code (in the case in question, 3).

In step c), diagrammatically shown in FIG. 4.3, the correction capability is disabled but a vertical decoding is carried out. This step has the only purpose to provide the decoder with information about vertical coordinates of errors. This information is derived by the "KO" issued after vertical decoding.

Thus, from a combination of the information obtained in steps b) and c), the coordinates of the errored cells become fully known.

Figure 5:
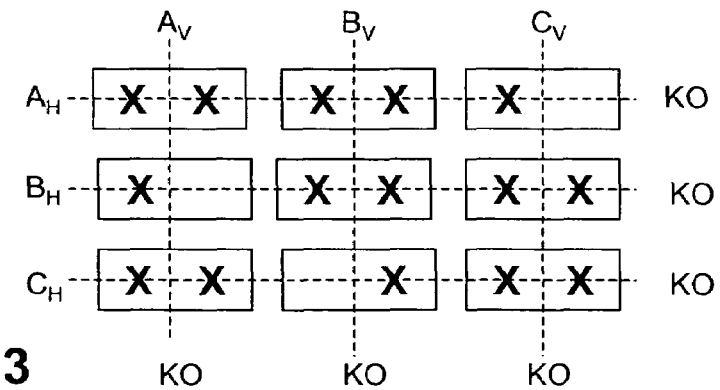
FIG. 5 shows a further exemplifying pattern of errors which could be corrected by the present invention.
Figure 5:
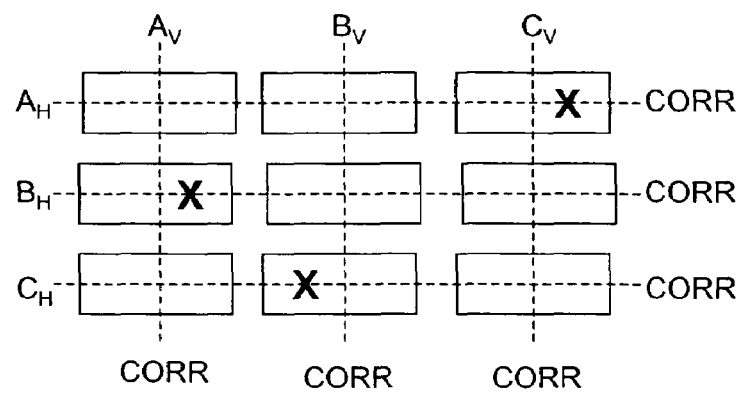
Figure 5:
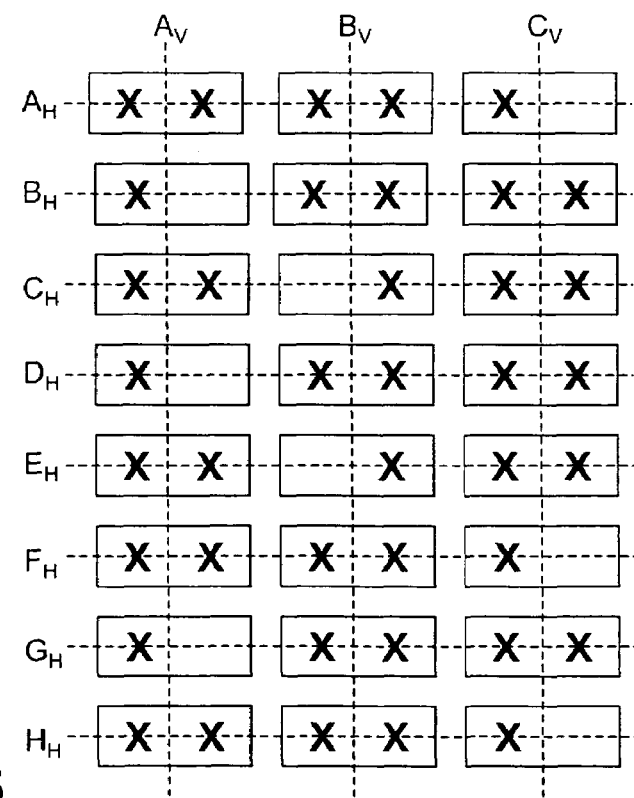
Figure 6:
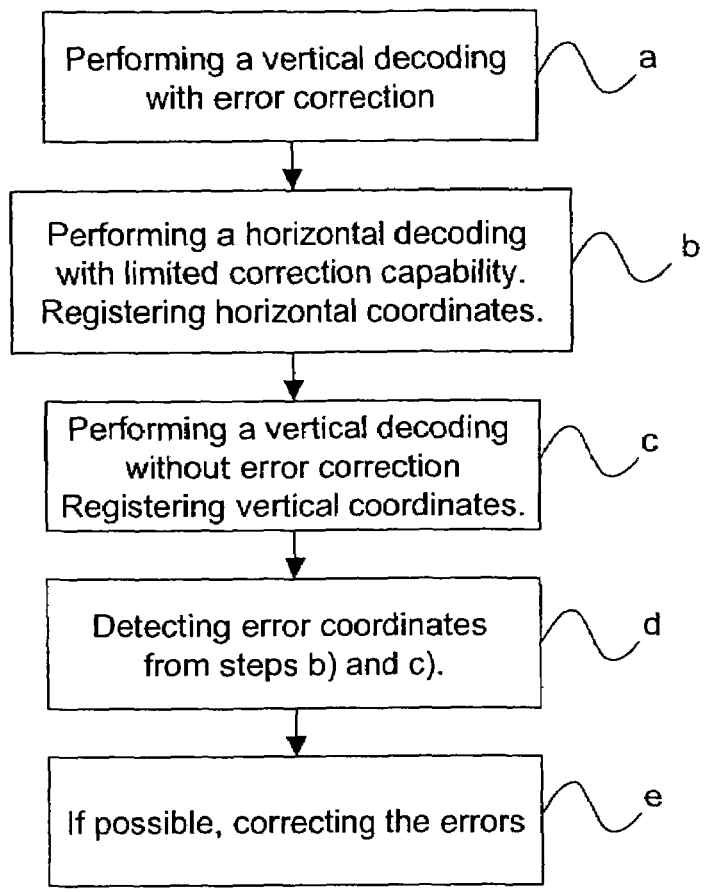
FIG. 6 shows a block diagram of the method according to the present invention.
Figure 7:
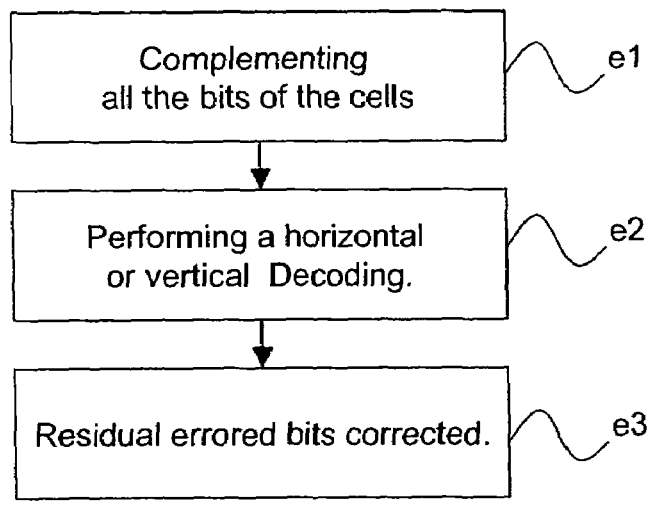
FIG. 7 shows the step of correcting errors according to one embodiment of the present invention.
Figure 8:
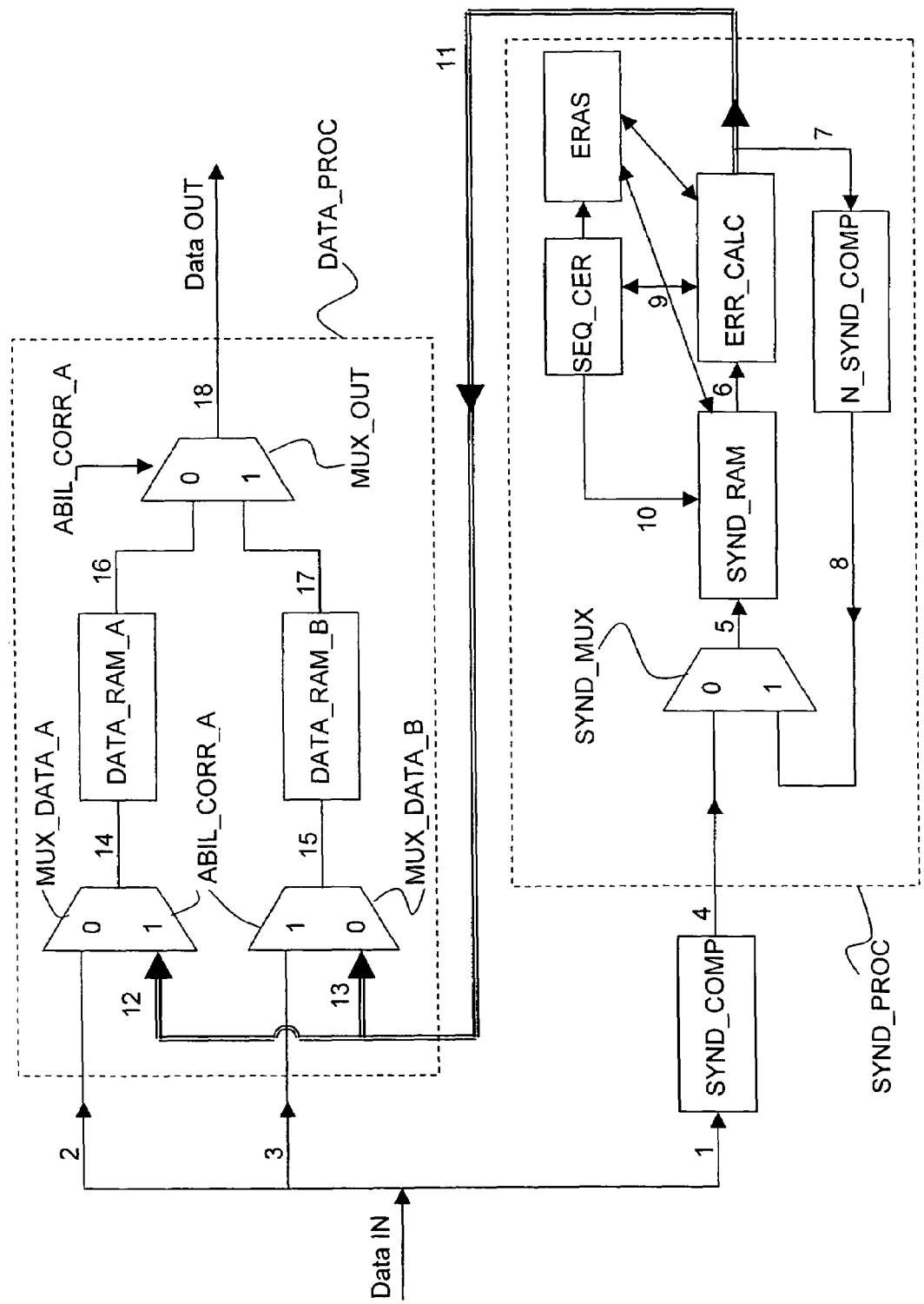
FIG. 8 shows an embodiment of a decoder according to the parallel European patent application.

In addition to error patterns as the ones of FIGS. 1*a*, 1*b* and 1*c*, the errors of more complex patterns could be detected. For instance, the coordinates of the errors in the pattern of FIG. 5 could be detectable.

Once the errored bit positions become known, a correction step could be carried out. Obviously, the correction to be performed depends on the code. For instance, for a BCH code, each bit of the pattern is complemented (see FIG. 4.4). In this way, the wrong bits become corrected and the corrected bits become wrong but the number of errored bits becomes compatible with the capacity of correction of the code. With further reference to FIG. 4.4, one single error (either in the horizontal or vertical codewords) will remain after the complementing step and these errors are easily correctable (CORR) by a horizontal or vertical decoding.

Figure 2A:
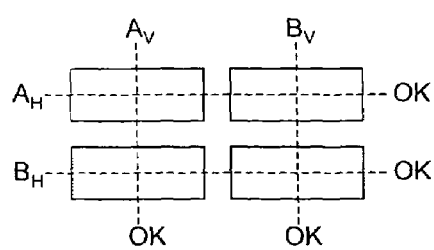
Figure 2B:
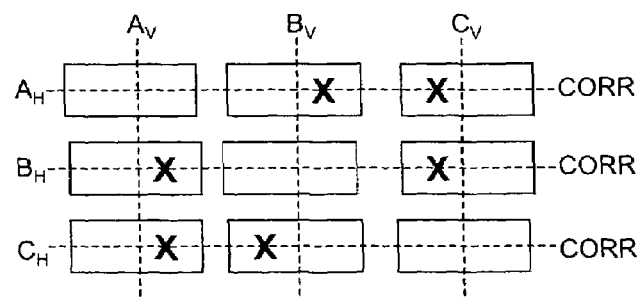

FIGS. 2*a* and 2*b* show the error patterns after the bit complementing step. In the case of FIG. 2*a*, all the errors have been removed. In FIG. 2*b*, only two errors are in both vertical and horizontal codewords. These errors could be easily corrected (CORR) by applying a simple vertical or horizontal decoding.

Profitably, the method according to the present invention is implemented in connection with the method and decoder of the above mentioned parallel European patent application having title "improved iterative n-dimensional decoding" which is incorporated herewith as a reference.

We claim:

1. A method for correcting a pattern of errors by a two-dimensional decoding, the pattern of errors comprising at least two codewords in both a first dimension and a second dimension with a number of errors in common higher than the capacity of the code which is used for decoding,
the method comprising the steps of:
   a) performing a full capacity decoding along the second dimension for removing possible false corrections introduced by a previous decoding performed along the first dimension;
   b) performing a reduced-capacity decoding along the first dimension, for identifying errored codewords along the first dimension;
   c) performing a full capacity decoding along the second dimension with disabled correction feature for identifying errored codewords along the second dimension;
   d) detecting the error coordinates from the information from steps b) and c); and
   e) correcting the detected pattern of errors.

2. The method according to claim 1, wherein said first dimension and said second dimension are the horizontal and the vertical dimension, respectively.

3. The method according to claim 1, wherein the full capacity is three errors in both the first and second dimensions.

4. The method according to claim 1, wherein the step of performing a reduced-capacity decoding along the first dimension comprises the step of performing a decoding at a correction capacity limited to two errors.

5. The method according to claim 1, wherein step e) comprises e1) complementing all the errored cells and then e2) performing a decoding along at least one between said first and second dimensions, thus correcting any residual error.

6. The method according to claim 5, wherein step e2) comprises performing a decoding along the first dimension with a full correction capacity.

7. A computer readable medium having recorded thereon, a computer program executed by a computer for performing a method for correcting a pattern of errors by a two-dimensional decoding, the pattern of errors comprising at least two codewords in both a first dimension and a second dimension with a number of errors in common higher than the capacity of the code which is used for decoding, the method comprising the steps of:
   a) performing a full capacity decoding along the second dimension for removing possible false corrections introduced by a previous decoding performed along the first demension;
   b) performing a reduced-capacity decoding along the first dimension, for identifying errored codewords along the first dimension;
   c) performing a full capacity decoding along the second dimension with disabled correction feature for identifying errored codewords along the second dimension
   d) detecting the error coordinates from the information from steps b) and c); and
   e) correcting the detected pattern of errors.

8. An erasure forward error correction decoder for correcting a pattern of errors by a two-dimensional decoding, the pattern of errors comprising at least two codewords in both a first dimension and a second dimension with a number of errors in common higher than the capacity of the code which is used for decoding,
wherein the decoder comprises:
   first decoding means for performing a full capacity decoding along the second dimension for removing possible false corrections introduced by a previous decoding performed along the first dimension;
   second decoding means for performing a reduced-capacity decoding along the first dimension, for identifying errored codewords along the first dimension;
   said first decoding means performing also a full capacity decoding along the second dimension with disabled correction feature for identifying errored codewords along the second dimension;
   position error detection means for detecting the error coordinates from the information from the first and second decoding means; and
   correction means for correcting the detected pattern of errors.

9. The decoder according to claim 8, wherein said first dimension and said second dimension are the horizontal and the vertical dimensions, respectively.

10. The decoder according to claim 8, wherein the full capacity of the decoder is three errors in both the first and second dimensions.

11. The decoder according to claim 8, wherein the second decoding means for performing a reduced-capacity decoding also performs a decoding at a correction capacity limited to two errors.

12. The decoder according claim 8, wherein the correction means complement all the errored cells and then perform a decoding along at least one between said first and second dimensions.

13. A telecommunication apparatus comprising an erasure forward error correction decoder for correcting a pattern of errors by a two-dimensional decoding, the pattern of errors comprising at least two codewords in both a first dimension and a second dimension with a number of errors in common higher than the capacity of the code which is used for decoding, wherein the decoder comprises:

first decoding means for performing a full capacity decoding along the second dimension for removing possible false corrections introduced by a previous decoding performed along the first dimension;

second decoding means for performing a reduced-capacity decoding along the first dimension, for identifying errored codewords along the first dimension;

said first decoding means performing also a full capacity decoding along the second dimension with disabled correction feature for identifying errored codewords along the second demension;

position error detection means for detecting the error coordinates from the information from the first and second decoding means; and correction means for correcting the detected pattern of errors.

* * * * *